United States Patent [19]

Lesser

[11] 4,100,430
[45] Jul. 11, 1978

[54] MULTI-PHASE AND GATE
[75] Inventor: Mark B. Lesser, Laguna Niguel, Calif.
[73] Assignee: Rockwell International Corporation, El Segundo, Calif.
[21] Appl. No.: 774,714
[22] Filed: Mar. 7, 1977
[51] Int. Cl.² ............... H03K 19/22; H03K 19/08
[52] U.S. Cl. .............. 307/205; 307/200 B; 307/207; 307/208; 307/215; 307/218; 307/DIG. 1
[58] Field of Search ............. 307/205, 207, 200 B, 307/208, 215, 218, DIG. 1

[56] References Cited
U.S. PATENT DOCUMENTS 3,617,767 11/1971 Booher .................... 307/208 X
3,935,474 1/1976 Komarek ................. 307/205
3,942,162 3/1976 Buchanan ............... 307/205 X
4,042,833 8/1977 Lesser ..................... 307/205 X Primary Examiner—Larry N. Anagnos
Attorney, Agent, or Firm—H. Fredrick Hamann; G. Donald Weber, Jr.; Morland C. Fischer

[57] ABSTRACT

A no-delay, ratioless AND gate compatible with a four-phase, major-minor clocking scheme and a six-phase metal oxide semiconductor (MOS) system. The disclosed AND gate can be implemented by the interconnection of first and second field effect transistors having conduction paths thereof selectively connected between a respective input terminal and the output terminal of the AND gate to precharge and conditionally discharge the output terminal.

9 Claims, 3 Drawing Figures

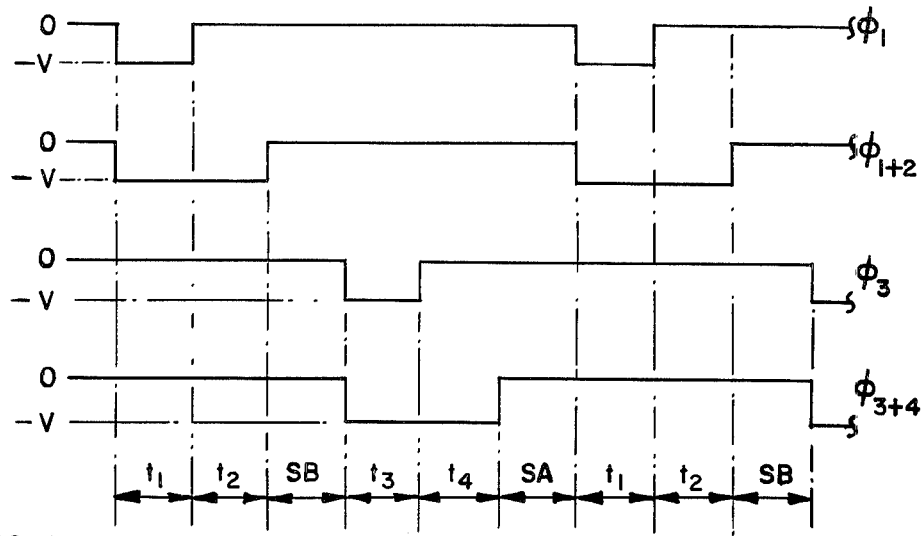
FIG. I
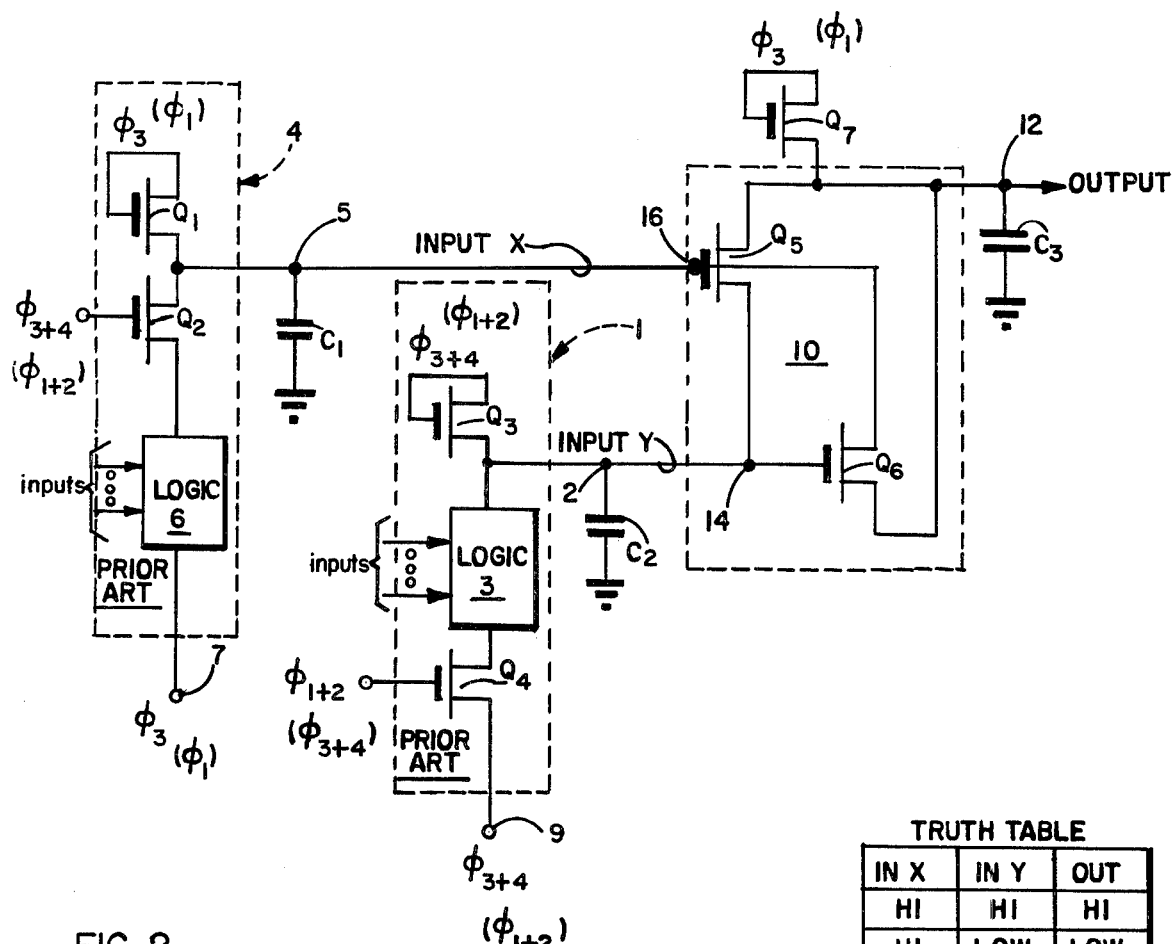
FIG. 2
| TRUTH TABLE | | |
|---|---|---|
| IN X | IN Y | OUT |
| HI | HI | HI |
| HI | LOW | LOW |
| LOW | HI | LOW |
| LOW | LOW | LOW |
FIG. 3

MULTI-PHASE AND GATE

BACKGROUND OF THE INVENTION

1. Field of the Invention

This invention relates to an integrated circuit, no-delay AND gate compatible with a four-phase, major-minor metal oxide semiconductor (MOS) system.

2. Prior Art

A type 1 inverter gate (which evaluates during a $\phi_1$ multi-phase clock signal) and a type 4 inverter gate (which evaluates during a $\phi_4$ multi-phase clock signal) are shown and described in U.S. Ser. No. 659,057 filed Feb. 18, 1976, and now abandoned. It is known to those skilled in the art that the output signal from a type 1 inverter gate can be applied to the input of a type 2 inverter gate (which evaluates during the $\phi_2$ multi-phase clock signal). It is also known that the output signal from a type 4 inverter gate can be applied to the input of a type 2 inverter gate. However, no efficient gating means is known by which to concurrently fan the output signals from both the type 1 and 4 inverter gates into the type 2 inverter gate without the utilization of complex interface logic, inasmuch as no controllable time interval is available in a conventional four-phase clocking scheme to permit the fan-in to occur.

Prior art attempts to resolve the problem of fanning the type 1 and 4 inverter gates into a type 2 inverter gate have included interface gating means such as d.c. inverters, amplifiers or the like. However, the prior art attempt to employ interface gating means results in an undesirable gating time delay, as well as d.c. power loss, increased space consumption and uneconomical costs.

SUMMARY OF THE INVENTION

Briefly, in general terms, an AND gate is disclosed, which AND gate is mechanized so as to fan the output signals of type 1 and 4 inverter gates directly into a type 2 inverter gate without interface logic time delay or d.c. power loss, common to conventional fan-in gating attempts. The AND gate is implemented from first and second field effect transistor devices. A control electrode of the first transistor device is connected to a first conduction path electrode of the second transistor device at a first input terminal of the AND gate. A control electrode of the second transistor device is connected to a first conduction path electrode of the first transistor device at a second input terminal of the AND gate. A second conduction path electrode of each of the first and second transistor devices are connected together at an output terminal of the AND gate. The AND gate is ratioless and is compatible with a four-phase, major-minor clocking scheme having six controllable levels of logic.

BRIEF DESCRIPTION OF THE DRAWINGS

FIG. 1 shows the four-phase, major-minor clocking scheme utilized to strobe the AND gate of the present invention.

FIG. 2 shows a schematic circuit diagram to implement the AND gate of the present invention.

FIG. 3 is a truth table for the AND gate of FIG. 2.

DESCRIPTION OF THE PREFERRED EMBODIMENT

FIG. 1 of the accompanying drawings shows the major-minor (i.e. wide-narrow) four phase clocking scheme utilized to strobe the AND gate, which forms the present invention, and the associated input gate means therefor. The waveform of each recurring four-phase clock signal $\phi_1, \phi_{1+2}, \phi_3, \phi_{3+4}$ has relatively HI (i.e. true) and LOW (i.e. false) signal levels corresponding, for example, to $-V$ volts and ground, respectively. $\phi_{1+2}$ and $\phi_{3+4}$ are designated major clock phases. The intervals, SB and SA, occurring between the major clock phases are designated in-between clock phases. As will be explained in greater detail hereinafter, by utilizing four-phase clock signals having in-between clock phases, the AND gate of the present invention is responsive to a recurring four phase clock signal having six controllable levels of logic.

Referring to FIG. 2 of the drawings, the AND gate 10 and the associated input gate means 1 and 4 are illustrated. The schematic circuit diagram of the input gate means 4, commonly designated logic type 4, includes field effect transistors (FETs) $Q_1$ and $Q_2$. One conduction path electrode of FET $Q_1$ and the control or gate electrode thereof are connected together and to clock terminal means to receive the clock signal $\phi_3$, the waveform of which is illustrated in FIG. 1. The second conduction path electrode of FET $Q_1$ and a first conduction path electrode of FET $Q_2$ are connected together at a common electrical junction 5 with one plate of a storage capacitor $C_1$. Electrical junction 5 corresponds to the output terminal of the input gate means 4. The second plate of storage capacitor $C_1$ is connected to a source of reference potential such as ground. Suitable logic 6 is connected between the second conduction path electrode of FET $Q_2$ and clock terminal means 7, which receives the clock signal $\phi_3$. The control or gate electrode of FET $Q_2$ is connected to clock terminal means to receive the clock signal $\phi_{3+4}$, the waveform of which is illustrated in FIG. 1. The operation of the input gate means 4 is known to those skilled in the art. However, for a more detailed understanding thereof, reference may be made to U.S. Pat. application Ser. No. 659,057 filed Feb. 18, 1976, which is, hereby, incorporated by reference. As will be understood by those skilled in the art, the input gate means 4 (i.e. logic type 4) precharges both output terminal 5 and storage capacitor $C_1$ via the conduction path of FET $Q_1$ during the $t_3$ time interval (of FIG. 1) and evaluates (i.e. conditionally discharges output terminal 5 and storage capacitor $C_1$) via the conduction paths of FET $Q_2$ and logic 6 during the $t_4$ time interval.

The schematic circuit diagram of the input gate means 1, commonly designated logic type 1 or 1B, includes FETs $Q_3$ and $Q_4$. One conduction path electrode of FET $Q_3$ and the gate electrode thereof are connected together and to clock terminal means to receive the clock signal $\phi_{3+4}$. The second conduction path electrode of FET $Q_3$ is connected to a common electrical junction 2 with one plate of a storage capacitor $C_2$. Electrical junction 2 corresponds to the output terminal of input gate means 1. The second plate of storage capacitor $C_2$ is connected to a source of reference potential, such as ground. Suitable logic 3 is connected between common electrical junction 2 and one conduction path electrode of FET $Q_4$. The second conduction path electrode of FET $Q_4$ is connected to clock terminal means 9 to receive the clock signal $\phi_{3+4}$. The gate electrode of FET $Q_4$ is connected to clock terminal means to receive the clock signal $\phi_{1+2}$, the waveform of which is illustrated in FIG. 1. The operation of the input gate means 1 is known to those skilled in the art. However, reference may also be made to the aforementioned U.S.

Pat. application Ser. No. 659,057 for a more detailed explanation thereof. As will be understood by those skilled in the art, the input gate means 1 (i.e. logic type 1) precharges both output terminal 2 and storage capacitor $C_2$ via the conduction path of FET $Q_3$ during each of the $t_3$ and $t_4$ time intervals of FIG. 1 and evaluates or conditionally discharges output terminal 2 and storage capacitor $C_2$ via the conduction paths of logic 3 and FET $Q_4$ during the $t_1$ time interval.

In accordance with the instant invention, a schematic circuit 10 is shown to mechanize an AND gate which is capable of receiving first and second input signals, designated X and Y, corresponding to the respective output signals at terminals 5 and 2 of gate means 4 and 1. INPUT X and Y signals represent the logical output states of gate means 4 and 1 after their respective evaluation time intervals. AND gate 10 includes p-channel FETs $Q_5$ and $Q_6$. One conduction path electrode of each of FETs $Q_5$ and $Q_6$ are connected together and to a common electrical junction 12 which comprises the output terminal of AND gate 10. The second conduction path electrode of FET $Q_5$ and the gate electrode of FET $Q_6$ are connected together and to the output terminal 2 of gate means 1 at a common electrical junction 14. Electrical junction 14 corresponds to one input terminal of the present AND gate 10. The second conduction path electrode of FET $Q_6$ and the gate electrode of FET $Q_5$ are connected together and to the output terminal 5 of gate means 4 at a common electrical junction 16. Electrical junction 16 corresponds to a second input terminal of the present AND gate 10. Hence, first and second INPUT signals, X and Y, are applied from the respective output terminals 5 and 2 of the gate means 4 and 1 to the input terminals 16 and 14 of the AND gate 10. One plate of a storage capacitor $C_3$ is connected to output terminal 12. A second plate of storage capacitor $C_3$ is connected to a source of reference potential, such as ground.

The AND gate 10 may also include a precharge p-channel FET $Q_7$. One conduction path electrode and the gate electrode of FET $Q_7$ are connected together and to clock terminal means to receive the clock signal $\phi_3$. The second conduction path electrode of FET $Q_7$ is connected to the output terminal 12 of AND gate 10. It is to be understood, however, that the presence of FET $Q_7$ is optional, the utilization of which will be explained in greater detail hereinafter.

The operation of the AND gate 10 of the present invention is explained by concurrently referring to FIGS. 1-3. During the interval of time $t_3$, a relatively HI (true) level clock signal $\phi_3$ is applied to the gate and conduction path electrodes of FET $Q_1$. Hence, FET $Q_1$ is rendered conductive, and storage capacitor $C_1$ and output terminal 5 of input gate means 4 are precharged via the conduction path of FET $Q_1$. Also during the $t_3$ time interval, a relatively HI level clock signal $\phi_{3+4}$ is applied to the gate and conduction path electrodes of FET $Q_3$. Hence, FET $Q_3$ is rendered conductive, and storage capacitor $C_2$ and output terminal 2 of input gate means 1 are also precharged. FETs $Q_5$ and $Q_6$, which comprise the AND gate 10, are also rendered conductive during the $t_3$ time interval, inasmuch as the gate electrodes thereof are respectively connected to the output terminals 5 and 2 of gate means 4 and 1 to receive relatively HI level INPUT X and Y signals at the input terminals 16 and 14 of the AND gate 10. Therefore, both the output terminal 12 and the storage capacitor $C_3$ of the AND gate 10 are precharged via the conduction paths of FETs $Q_5$ and $Q_6$ to a voltage, $-V + 2V_p$, approximately two thresholds more positive than the voltage of the relatively HI level clock signal $\phi_3$ during the $t_3$ clock interval.

However, as previously disclosed, precharge FET $Q_7$ may also be utilized. Thus, during the $t_3$ time interval, a relatively HI level clock signal $\phi_3$ is applied to the gate and conduction path electrodes of FET $Q_7$. Hence, FET $Q_7$ is rendered conductive, and the output terminal 12 and storage capacitor $C_3$ of the AND gate 10 are both precharged via the conduction path of FET $Q_7$ to a voltage, $-V + V_p$, which voltage is approximately only one threshold more positive than the $\phi_3$ clock signal during the $t_3$ time interval.

During the following time interval, $t_4$, a relatively HI level clock signal $\phi_{3+4}$ continues to be applied to the gate and conduction path electrodes of FET $Q_3$. Both storage capacitor $C_2$ and output terminal 2 of input gate means 1 remain charged via the conduction path of FET $Q_3$ during the $t_4$ time interval. Therefore, a relatively HI level INPUT Y signal continues to be applied to the input terminal 14 of the AND gate 10. Hence, FET $Q_6$ of AND gate 10 remains conductive during the $t_4$ time interval. However, as previously disclosed, input gate means 4 evaluates during the $t_4$ time interval. That is, a relatively LOW level clock signal $\phi_3$ is applied to the gate and conduction path electrodes of FET $Q_1$ and to the clock terminal means 7. Thus, FET $Q_1$ is rendered non-conductive. A relatively HI level clock signal $\phi_{3+4}$ is applied to the gate electrode of FET $Q_2$, and FET $Q_2$ is rendered conductive. If preselected logic conditions are satisfied during the $t_4$ time interval such that the input signals applied to the logic 6 of gate means 4 cause the completion of a conduction path between the output terminal 5 of gate means 4 and clock terminal means 7, both the storage capacitor $C_1$ and output terminal 5 are discharged (to ground) at clock terminal means 7. Hence, a relatively LOW level INPUT X signal is applied to the input terminal 16 of the AND gate 10. FET $Q_5$ is rendered non-conductive, inasmuch as the gate electrode thereof is connected to input terminal 16. The storage capacitor $C_3$ and the output terminal 12 of AND gate 10 are discharged (to ground) at clock terminal means 7 via the conduction paths of logic 6 and FETs $Q_2$ and $Q_6$. Therefore, during the $t_4$ time interval, and as indicated by the truth table of FIG. 3, whenever a relatively LOW level INPUT X signal is applied to input terminal 16 of the AND gate 10, a relatively LOW level OUTPUT signal is correspondingly applied to output terminal 12.

However, should an input signal be applied to logic 6 during the $t_4$ time interval to otherwise disable the conduction path between output terminal 5 and the clock terminal means 7 of input gate means 4, output terminal 5 and storage capacitor $C_1$ remain charged. Hence, a relatively HI level INPUT X signal is applied to the input terminal 16 of AND gate 10, and FET $Q_5$ remains conductive. Both the storage capacitor $C_3$ and the output terminal 12 of AND gate 10 remain charged, inasmuch as no discharge path is available to connect output terminal 12 to clock terminal 7 (i.e. ground). Therefore, during the $t_4$ time interval, and as indicated by the truth table of FIG. 3, whenever a relatively HI level INPUT X signal is applied to input terminal 16 and a relatively HI level INPUT Y signal is applied to input terminal 14, a relatively HI level OUTPUT signal is correspondingly applied to the output terminal 12 of the AND gate 10.

During the SA in-between time interval, relatively LOW level clock signals are applied to each of the respective gate electrodes of FETs $Q_1$, $Q_2$, $Q_3$ and $Q_4$ comprising input gate means 4 and 1. Hence, these aforementioned FETs are rendered non-conductive, and the respective output terminals 5 and 2 of gate means 4 and 1 are electrically isolated from the input signals applied to logic 6 and 3. Therefore, during the SA in-between time interval, storage capacitor $C_3$ retains its charge, and the logic level of the OUTPUT signal of AND gate 10 at output terminal 12 is preserved at the same logic level as during the preceding $t_4$ time interval.

During the following $t_1$ time interval, relatively LOW level clock signals $\phi_3$ and $\phi_{3+4}$ continue to be applied to the gate electrodes of FETs $Q_1$ and $Q_2$ and to clock terminal means 7 of input gate means 4. Hence, FETs $Q_1$ and $Q_2$ remain in a non-conductive condition, and the output terminal 5 of gate means 4 remains electrically isolated from the input signals applied to logic 6. Thus, during the $t_1$ time interval, the INPUT X signal applied from the output terminal 5 of gate means 4 to the input terminal 16 of AND gate 10 retains the same logic level as during the preceding SA time interval. Also during the $t_1$ time interval, a relatively LOW level clock signal $\phi_{3+4}$ is applied to the gate electrode of FET $Q_3$ and to clock terminal means 9 of gate means 1, and a relatively HI level clock signal $\phi_{1+2}$ is applied to the gate electrode of FET $Q_4$. Therefore, FET $Q_3$ is rendered non-conductive, and FET $Q_4$ is rendered conductive.

As previously disclosed, input gate means 1 evaluates during the $t_1$ time interval. Therefore, if preselected logic conditions are satisfied during the $t_1$ time interval such that the input signals applied to the logic 3 of gate means 1 cause the completion of a conduction path between the output terminal 2 of the gate means 1 and clock terminal means 9, storage capacitor $C_2$ and output terminal 2 (formerly charged during each of the $t_3$ — SA time intervals) are both discharged (to ground) at clock terminal means 9. Hence, a relatively LOW level INPUT signal is applied to the input terminal 14 of the AND gate 10. FET $Q_6$ is rendered non-conductive during the $t_1$ time interval, inasmuch as the gate electrode thereof is connected to input terminal 14. The storage capacitor $C_3$ and the output terminal 12 of AND gate 10 are also discharged (to ground) at clock terminal means 9 via the conduction paths of FET $Q_4$, logic 3 and FET $Q_5$, provided that the INPUT X signal applied to the input terminal 16 of AND gate 10 during the $t_1$ time interval has a relatively HI logic level.

However, should the INPUT X signal applied to the input terminal 16 of AND gate 10 have a relatively LOW logic level during the prior $t_4$ and SA time intervals (whereby the output terminal 12 and the charge storage capacitor $C_3$ of AND gate 10 are discharged), then the output terminal 12 and charge storage capacitor $C_3$ remained discharged during the $t_1$ time interval. Therefore, during the $t_1$ time interval, and as indicated by the truth table of FIG. 3, whenever a relatively LOW level INPUT Y signal is applied to input terminal 14 of the AND gate 10, a relatively LOW level OUTPUT signal is correspondingly applied to output terminal 12.

During the following $t_2$ time interval, the output terminal 12 of the AND gate 10 is holding information. That is, the output terminal 12 of AND gate 10 is electrically isolated from the input signals applied to the respective logic 6 and 3 of input gate means 4 and 1.

Thus, during the $t_2$ time interval, storage capacitor $C_3$ retains any charge, and the logic level of the OUTPUT signal of AND gate 10 at output terminal 12 is preserved at the same logic level as during the preceding $t_1$ time interval. During the $t_2$ time interval, when AND gate 10 is holding information at the output terminal 12, the corresponding OUTPUT signal thereof is valid (i.e. in a condition to be supplied to another gate means (not shown) which evaluates during the $t_2$ time interval). Moreover, the INPUT X and Y signals are also valid, inasmuch as input gate means 4 and 1 are also holding information at the respective output terminals 5 and 2 thereof during the $t_2$ time interval. An example of a gate means which evaluates during the $t_2$ time interval and is adpated to accept the OUTPUT signal of AND gate 10 is that commonly designated a logic gate type 2, illustrated and described in the aforementioned U.S. Ser. No. 659,057. Moreover, the type 2 logic gate means can be connected directly to the output terminal 12 of AND gate 10 without the requirement of additional interface logic (e.g. inverters, amplifiers and the like) and the undesirable resulting time delay, space consumption and d.c. power loss.

During the succeeding SB in-between time interval, relatively LOW level clock signals are applied to each of the respective gate electrodes of FETs $Q_1$, $Q_2$, $Q_3$ and $Q_4$ comprising input gate means 4 and 1. Hence, these aforementioned FETs are rendered non-conductive, and the respective output terminals 5 and 2 of gate means 4 and 1 remain electrically isolated from the input signals applied to the logic 6 and 3. Therefore, during the SB in-between time interval, the AND gate 10 continues to hold information at output terminal 12. Hence, storage capacitor $C_3$ retains its charge, and the OUTPUT signal of AND gate 10 at output terminal 12 is preserved at the same logic level as during the preceding $t_2$ time interval.

It will be apparent that while a preferred embodiment of the invention is shown and described, various modifications and changes may be made without departing from the true spirit and scope of the invention. For example, FETs $Q_5 - Q_7$ are p-channel transistor devices. However, it is to be understood that these or any other suitable multi-terminal semiconductor devices may be employed. What is more, the clock signals $\phi_{3+4}$, $\phi_3$ and $\phi_{1+2}$ may be interchanged with the respective clock signals $\phi_{1+2}$, $\phi_1$ and $\phi_{3+4}$ (i.e. clock signal $\phi_{1+2}$ is applied to FETs $Q_2$ and $Q_3$ and to clock terminal means 9, clock signal $\phi_1$ is applied to FETs $Q_1$ and $Q_7$ and to clock terminal means 7, and clock signal $\phi_{3+4}$ is applied to FET $Q_4$). In this case, the AND gate 10 is holding information at output terminal 12, which information is valid during the $t_4$ time interval. The corresponding OUTPUT signal of the AND gate 10 is, thus, in a condition to be accepted by logic gate type 4, previously described herein.

Having thus set forth a preferred embodiment of the present invention, what is claimed is:

1. An AND gate having input and output terminals and comprising:
  first and second multi-terminal semiconductor devices, each of said multi-terminal devices having respective control and conduction path electrodes;
  a control electrode of a first of said multi-terminal semiconductor devices connected to a first conduction path electrode of the second of said multi-terminal semiconductor devices at a first input terminal of said AND gate;

a control electrode of said second multi-terminal semiconductor device connected to a first conduction path electrode of said first semiconductor device at a second input terminal of said AND gate;

a second conduction path electrode of each of said first and second semiconductor devices connected together at an output terminal of said AND gate and first and second signal source means connected to clock terminal means to receive recurring clock signals having multi-phase clock time intervals;

said first and second signal source means respectively connected to the first and second input terminals of said AND gate for controlling the operation of said AND gate;

the output terminal of said AND gate being precharged during a first of said multi-phase clock intervals;

the output terminal of said AND gate conditionally discharged via the first of said signal source means during a second of said multi-phase clock intervals;

the output terminal of said AND gate electrically isolated from the first and second input terminal means thereof and the first and second signal source means during a third of said multi-phase clock intervals;

the output terminal of said AND gate conditionally discharged via the second of said signal source means during a fourth of said multi-phase clock intervals; and the output terminal of said AND gate electrically isolated from the first and second input terminal means thereof and the first and second signal source means during fifth and sixth of said multi-phase clock intervals.

2. The AND gate recited in claim 1, including a third multi-terminal semiconductor device, said third multi-terminal device having a control and conduction path electrodes;

the control electrode and a first conduction path electrode of said third semiconductor device connected together and to clock terminal means to receive a multi-phase clock signal; and a second conduction path electrode of said third semiconductor device connected to said output terminal of said AND gate to precharge said output terminal.

3. The AND gate recited in claim 2, wherein each of said first, second and third multi-terminal semiconductor devices is a field effect transistor, each field effect transistor having a gate electrode corresponding to the respective control electrode of each of said first, second and third multi-terminal devices, and each field effect transistor having source and drain electrodes corresponding to the first and second conduction path electrodes of each of said first, second and third multi-terminal devices.

4. The AND gate recited in claim 1 including output means connected to the output terminal of said AND gate to be driven therefrom during the fifth of said multi-phase clock intervals.

5. The AND gate recited in claim 1 wherein said first, second, third, fourth, fifth and sixth clock intervals are consecutive time intervals.

6. Clock control ratioless logic gate means having at least first and second input terminal means and an output terminal means and a plurality of semiconductor devices having respective conduction paths selectively connected between said input and output terminal means;

said output terminal means charged to a first reference level via the conduction paths of first and second of said plurality of semiconductor devices during a first clock time interval;

said output terminal means conditionally discharged to a second reference level via the conduction path of said first semiconductor device during a second clock time interval if said first input terminal means is driven to said second reference level during said second time interval;

said output terminal means conditionally discharged to said second reference level via the conduction path of said second semiconductor device during a third time interval if said second input terminal means is driven to said second reference level during said third time interval; and said output terminal means electrically isolated from each of said first and second input terminal means during a fourth clock time interval if each of said first and second input terminal means is driven to said second reference level during said fourth time interval.

7. The logic gate means recited in claim 6, including a third semiconductor device having a conduction path connected between said output terminal means and clock terminal means to charge said output terminal means to said first reference level during said first clock time interval.

8. The logic gate means recited in claim 7, wherein said first, second and third semiconductor devices each comprises a field effect transistor.

9. The logic gate means recited in claim 6, including multi-phase clock signal generating means connected to said logic gate means to selectively control the charging and discharging of said output terminal means during said first, second, third, and fourth time intervals.

* * * * *